United States Patent
Zang et al.

(10) Patent No.: US 10,403,548 B2
(45) Date of Patent: Sep. 3, 2019

(54) FORMING SINGLE DIFFUSION BREAK AND END ISOLATION REGION AFTER METAL GATE REPLACEMENT, AND RELATED STRUCTURE

(71) Applicant: GLOBALFOUNDRIES Inc., Grand Cayman (KY)

(72) Inventors: Hui Zang, Guilderland, NY (US); Hong Yu, Rexford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/811,965

(22) Filed: Nov. 14, 2017

(65) Prior Publication Data

US 2019/0148242 A1 May 16, 2019

(51) Int. Cl.
- *H01L 21/8234* (2006.01)
- *H01L 29/06* (2006.01)
- *H01L 27/088* (2006.01)

(52) U.S. Cl.
CPC ........ *H01L 21/823481* (2013.01); *H01L 21/823431* (2013.01); *H01L 27/0886* (2013.01); *H01L 29/0649* (2013.01)

(58) Field of Classification Search
CPC combination set(s) only.
See application file for complete search history.

(56) References Cited

U.S. PATENT DOCUMENTS

| | | | |
|---|---|---|---|
| 6,383,931 B1 | 5/2002 | Flanner et al. | |
| 8,846,491 B1 | 9/2014 | Pham et al. | |
| 8,916,460 B1 | 12/2014 | Kwon et al. | |
| 9,171,752 B1 | 10/2015 | Wu et al. | |
| 9,263,516 B1 | 2/2016 | Wu et al. | |
| 9,337,099 B1 | 5/2016 | Jain et al. | |
| 9,412,616 B1 | 8/2016 | Xie et al. | |
| 9,412,660 B1 * | 8/2016 | Xie | H01L 21/76897 |
| 9,425,252 B1 | 8/2016 | Zang et al. | |
| 9,406,676 B2 | 9/2016 | Yu et al. | |
| 9,653,579 B2 | 5/2017 | Liu et al. | |
| 9,653,642 B1 | 5/2017 | Raring et al. | |

(Continued)

OTHER PUBLICATIONS

U.S. Appl. No. 15/811,957, Notice of Allowance dated Jul. 2, 2018, 20 pages.

(Continued)

*Primary Examiner* — Ratisha Mehta
(74) *Attorney, Agent, or Firm* — Francois Pagette; Hoffman Warnick LLC

(57) ABSTRACT

The disclosure relates to integrated circuit (IC) structures with a single diffusion break (SDB) and end isolation regions, and methods of forming the same after forming a metal gate. A structure may include: a plurality of fins positioned on a substrate; a plurality of metal gates each positioned on the plurality of fins and extending transversely across the plurality of fins; an insulator region positioned on and extending transversely across the plurality of fins between a pair of the plurality of metal gates; at least one single diffusion break (SDB) positioned within the insulator region and one of the plurality of fins; an end isolation region positioned laterally adjacent to a lateral end of one of the plurality of metal gates; and an insulator cap positioned on an upper surface of at least a portion of one of the plurality of metal gates.

14 Claims, 8 Drawing Sheets

(56) References Cited

U.S. PATENT DOCUMENTS

| | | |
|---|---|---|
| 2009/0081815 A1 | 3/2009 | Yamashita et al. |
| 2009/0242513 A1 | 10/2009 | Funk et al. |
| 2010/0036518 A1 | 2/2010 | Funk et al. |
| 2013/0311231 A1 | 11/2013 | Morinaga et al. |
| 2014/0001572 A1 | 1/2014 | Bohr et al. |
| 2014/0117454 A1 | 5/2014 | Liu et al. |
| 2015/0104918 A1 | 4/2015 | Liu et al. |
| 2015/0171082 A1 | 6/2015 | Choi et al. |
| 2016/0110489 A1 | 4/2016 | Schroeder et al. |
| 2016/0111524 A1 | 4/2016 | Ha et al. |
| 2016/0133632 A1 | 5/2016 | Park et al. |
| 2016/0190130 A1 | 6/2016 | Yu et al. |
| 2017/0005169 A1 | 1/2017 | Loubet et al. |
| 2017/0051884 A1 | 2/2017 | Raring et al. |
| 2017/0096777 A1 | 4/2017 | Park et al. |
| 2017/0098581 A1 | 4/2017 | Ho et al. |
| 2017/0236712 A1 | 8/2017 | Hsieh et al. |
| 2017/0256458 A1* | 9/2017 | Chang .............. H01L 21/823456 |
| 2018/0108749 A1 | 4/2018 | Greene et al. |

OTHER PUBLICATIONS

Wen et al., "CMOS Junctionless Field-Effect Transistors Manufacturing Cost Evaluation," IEEE Transactions on Semiconductor Manufacturing, vol. 26, No. 1, Feb. 2013, 7 pages.

U.S. Appl. No. 15/811,953, Notice of Allowance dated Sep. 6, 2018, 17 pages.

Branislav Curanovic, "Development of a fully-depleted thin-body FinFET process", (2003) Thesis. Rochester Institute of Technology. 130 pages.

Chiao-Ti Huang, "Electrical and Material Properties of Strained Silicon/Relaxed Silicon Germanium Heterostructures or Single-Electron Quantum Dot Applications", A Dissertation Presented to the Faculty of Princeton University in Candidacy for the Degree of Doctor of Philosophy, 127 pages (Jun. 2015).

Yu-Chih Tseng, "Interfaces and Junctions in Nanoscale Bottom-Up Semiconductor Devices", Electrical Engineering and Computer Sciences University of California at Berkeley Technical Report No. UCB-EECS-2009-65, 120 pages (May 17, 2009).

Khalil et al., "A Self-Calibrated On-Chip Phase-Noise Measurement Circuit With—75 dBc Single-Tone Sensitivity at 100 kHz Offset," IEEE Journal of Solid-State Circuits, vol. 42, No. 12, Dec. 2007, 8 pages.

Warren F. Walls, "Cross-Corelation Phase Noise Measurements," IEEE Frequency Control Symposium, 1992, pp. 257-261.

U.S. Appl. No. 15/811,961, Notice of Allowance dated May 1, 2019, 10 pages.

* cited by examiner

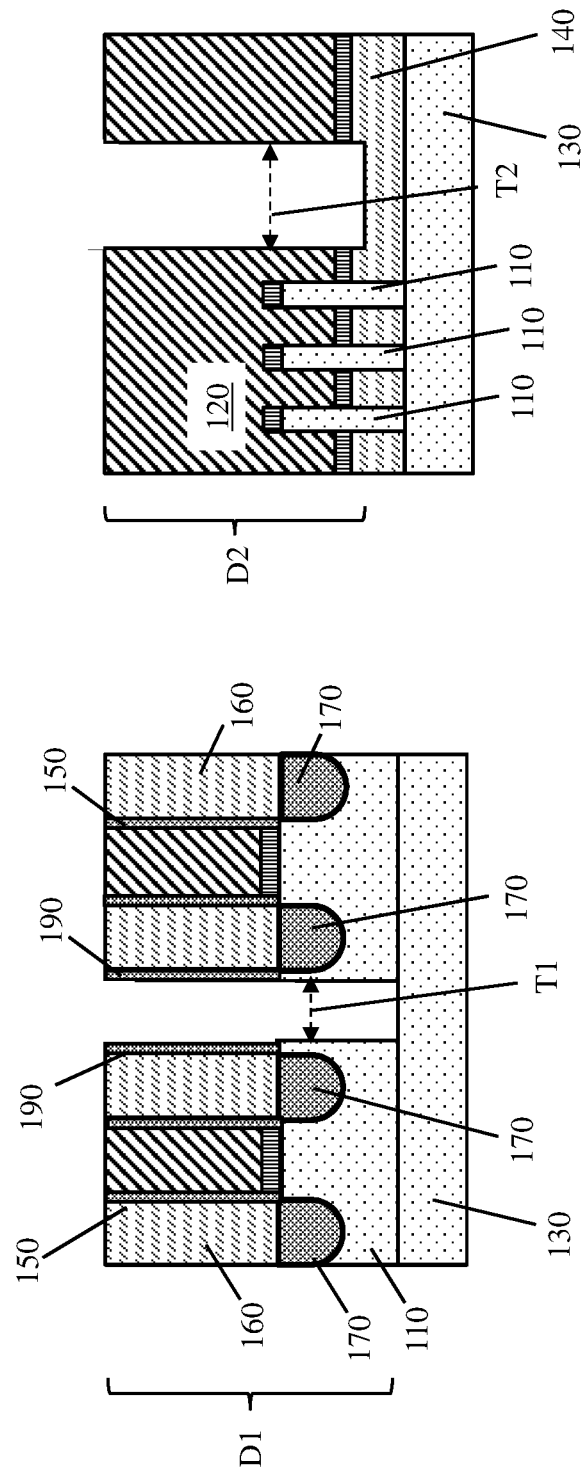

FORMING SINGLE DIFFUSION BREAK AND END ISOLATION REGION AFTER METAL GATE REPLACEMENT, AND RELATED STRUCTURE

BACKGROUND

Technical Field

The present application relates to methods of forming integrated circuit (IC) structures with varying isolation features, and structures associated with the disclosed methods. More particularly, the present application relates to processing techniques for creating single diffusion break (SDB) regions and an end isolation regions in an IC structure after metal gate replacement.

Related Art

Design systems are commonly used to design integrated circuits (ICs) and, in particular, to design front end of line (FEOL) components. As advances occur, smaller widths for wires and vias are provided. Additional design constrains imposed by smaller wire and via widths, e.g., requirements for uni-directional wiring at any metal layer, may preclude the use of non-linear wiring in a metal layer. The intended circuit structure must comply with these design rules before manufacture. Design rule spacing constraints can limit a variety of attributes, e.g., the maximum separation distance between adjacent gates in a cell array. Such constraints can affect the ability to form functional elements which connect gates and/or other structures together, e.g., two or more vias connecting to nearby positions of a single device layer.

To separate the various functional components of a product from each other, it may be necessary to form one or more isolation regions between two or more conductive or semiconductor regions of the product. Some isolation regions may be positioned over different types of components, e.g., over other insulating regions or over functional components. To accommodate the different locations and types of isolation regions, it is generally necessary to fabricate a different mask for each isolation structure and include various structural features, intermediate components, etc., to protect previously-formed structures or other regions from being processed to yield additional isolation regions. The structural differences at each location where an isolation region is needed may prevent the use of a single mask to form multiple types of isolation regions in the same structure.

SUMMARY

A first aspect of the disclosure provides an integrated circuit (IC) structure, including: providing a structure including: a plurality of fins positioned on a substrate, a plurality of shallow trench isolations (STIs) each positioned on the substrate laterally adjacent to one of the plurality of fins, a plurality of gates extending transversely across the plurality of fins, and an insulator region positioned laterally between the plurality of fins, forming a first trench by removing a portion of one of the plurality of gates and an underlying portion of one of the plurality of fins to expose the substrate thereunder; forming a second trench by removing portions of the plurality of gates to expose one of the plurality of STIs thereunder, the second trench extending substantially in parallel with the plurality of fins and positioned adjacent to a lateral end of a remaining portion of one of the plurality of gates; and forming an insulator within the first and second trenches.

A second aspect of the disclosure provides a method of forming an integrated circuit (IC) structure, the method including: providing a structure including: a plurality of fins positioned on a substrate, a plurality of shallow trench isolations (STIs) each positioned on the substrate laterally adjacent to one of the plurality of fins, a plurality of gates extending transversely across the plurality of fins, and an insulator region positioned laterally between the plurality of fins, forming a first trench by removing a portion of one of the plurality of gates and an underlying portion of one of the plurality of fins to expose the substrate thereunder; forming a second trench by removing portions of the plurality of gates to expose one of the plurality of STIs thereunder, the second trench extending substantially in parallel with the plurality of fins and positioned adjacent to a lateral end of a remaining portion of one of the plurality of gates; forming a plurality of gate trenches by selectively removing a portion of each of the plurality of gates; and forming an insulator within the first trench, the second trench, and the plurality of gate trenches.

A third aspect of the disclosure provides an integrated circuit (IC) structure, including: a plurality of fins positioned on a substrate; a plurality of metal gates each positioned on the plurality of fins and extending transversely across the plurality of fins; an insulator region positioned on and extending transversely across the plurality of fins between a pair of the plurality of metal gates; at least one single diffusion break (SDB) positioned within the insulator region and one of the plurality of fins, the at least one SDB extending from an upper surface of the substrate to an upper surface of the insulator region; an end isolation region positioned laterally adjacent to a lateral end of one of the plurality of metal gates; and an insulator cap positioned on an upper surface of at least a portion of one of the plurality of metal gates.

BRIEF DESCRIPTION OF THE DRAWINGS

The embodiments of this disclosure will be described in detail, with reference to the following figures, wherein like designations denote like elements, and wherein:

FIG. 8 shows a lateral cross-sectional view of removing the photoresist layer to expose other gate structures according to the disclosure.

FIG. 9 shows a longitudinal cross-sectional view of removing the photoresist layer to expose other gate structures according to the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

Figure 1:
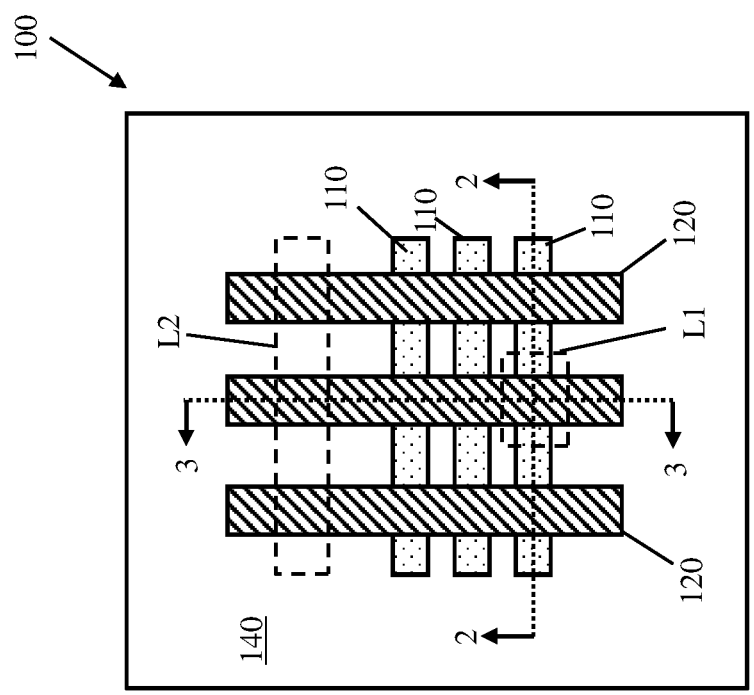
FIG. 1 shows a plan view of a structure to be processed according to the disclosure.

FIG. 1 provides a plan view of a structure 100 to be processed according to the present disclosure. The example structure 100 of FIG. 1 illustrates one preliminary set of materials targeted for use with embodiments of the disclosure, but it is understood that embodiments of the disclosure can be implemented on different designs without any change to the techniques discussed herein. Structure 100 can include a set (i.e., one or more) of fins 110 extending in a first direction, with three fins 110 being provided for the sake of example. Structure 100 may also include a set (i.e., one or more) of metal gates 120 extending transversely over fins 110, with each metal gate 120 having one or more regions positioned over corresponding fin(s) 110 in structure 100. A shallow trench isolation (STI) 140 (shown without cross-hatching in FIG. 1 solely for clarity) of structure 100 may be positioned underneath and/or adjacent to fin(s) 110 and metal gate(s) 120. Each metal gate 120 may be provided in the form of a replacement metal gate (RMG), i.e., a conductive material formed by removing a dummy gate structure and forming a conductive metal in place of the dummy gate during subsequent manufacture. Metal gate(s) 120 can be in the form of any currently known or later developed conductive material such as, e.g., aluminum (Al), zinc (Zn), indium (In), copper (Cu), indium copper (InCu), tin (Sn), tantalum (Ta), tantalum nitride (TaN), tantalum carbide (TaC)titanium (Ti), titanium nitride (TiN), titanium carbide (TiC), tungsten (W), tungsten nitride (WN), tungsten carbide (WC), and/or polysilicon (poly-Si) or combinations thereof. A design rule for a product may include two locations L1, L2, an electrical insulator may be formed, e.g., a diffusion break for electrically separating two portions of the same fin, or an end isolation region for laterally separating two metal gates 120 from each other. Although a first location L1 and two second locations L2 are shown in FIG. 1 for the purposes of example, it is understood that multiple first locations L1 and/or a single second location L2 may be processed according to the disclosure without modifying or otherwise departing from the various techniques discussed herein.

Figure 3:
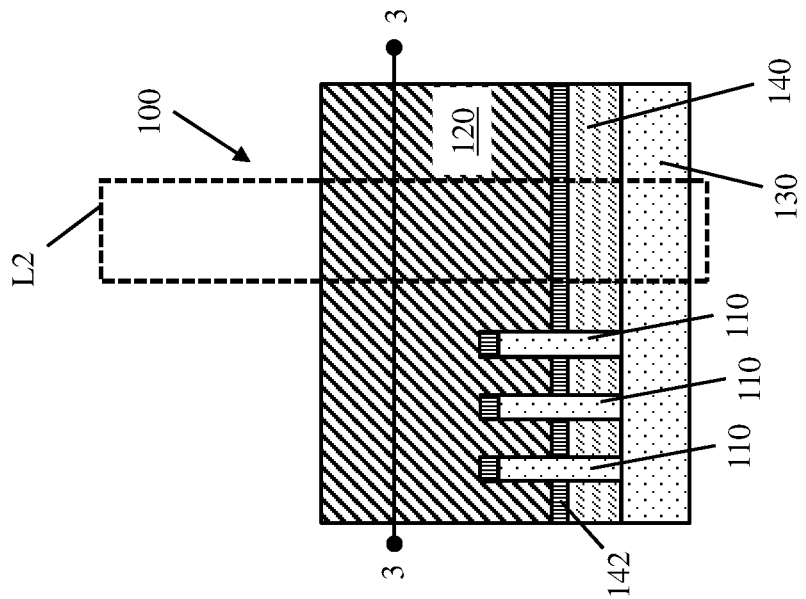
FIG. 3 shows a longitudinal cross-sectional view, along line 3-3 of FIG. 1 of, a structure to be processed according to the disclosure.
Figure 2:
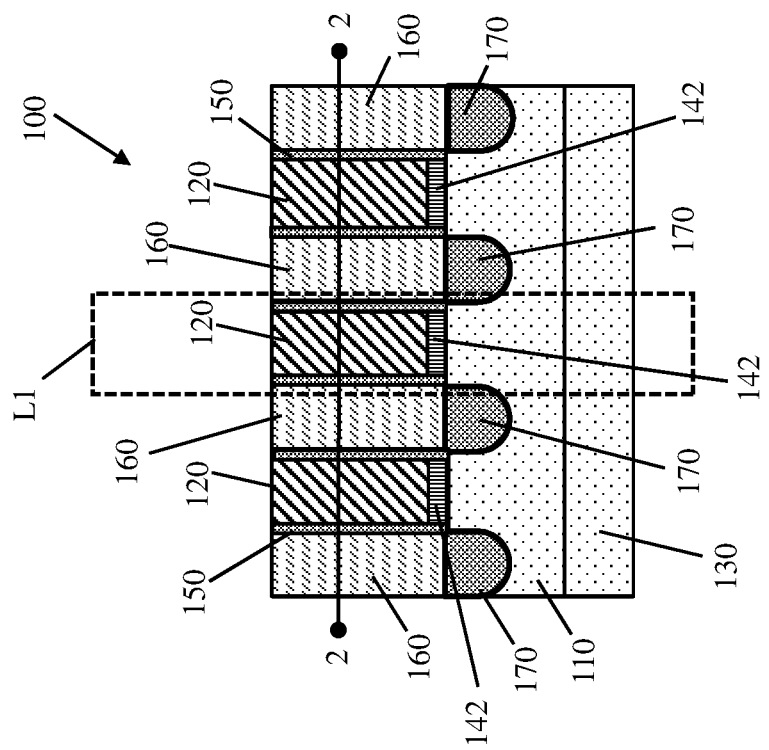
FIG. 2 shows a lateral cross-sectional view, along line 2-2 of FIG. 1, of a structure being processed according to the disclosure.

Referring to FIGS. 2-3, together, the various components of structure 100 are discussed in further detail to better illustrate subsequent processing in embodiments of the disclosure. First and second locations L1, L2 are also depicted in FIGS. 2-3 for correspondence with FIG. 1. Each fin 110 can be formed from an underlying semiconductor substrate 130, e.g., by removing targeted portions of substrate 130 to a predetermined depth, causing the non-removed portions to form fins 110 directly on substrate 130. Substrate 130 can include, e.g., one or more currently-known or later developed semiconductor substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Structure 100 may include at least one shallow trench isolation (STI) 140 (FIG. 3 only) positioned on substrate 130, as well as between fins 110 and metal gates 120. Each STI 140 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

As noted elsewhere herein, metal gates 120 can be formed from a conductive material and positioned above fin(s) 110 and STI(s) 140 to allow for electrical control of fin conductivity in a device structure. Metal gates 120 thus may cover one or more semiconductor fins 110 positioned above substrate 130, e.g., by coating exposed sidewalls and an upper surface of fin(s) 110. A gate dielectric 142 may be positioned underneath each metal gate 142, and on an upper surface of fin(s) 110 and STI(s) 140 where applicable. Gate dielectric 142 can include one or more dielectric materials discussed generally herein and/or can include other materials. As examples, gate dielectric 142 can include silicon oxide ($SiO_2$), hafnium oxide ($HfO_2$), zirconium silicate ($ZrSiO_4$), and/or other types of dielectric materials.

Metal gate(s) 120 can also include gate spacers 150. Gate spacer(s) 150 can be provided as one or more bodies of insulating material formed on exposed portions of metal gate(s) 120, STI(s) 140, and/or gate dielectric(s) 142, e.g., by deposition, thermal growth, etc., and may include materials and/or other structures formed on or adjacent to metal gate(s) 120 to electrically and physically insulate metal gate(s) 120 from other components of structure 100. In an example embodiment, gate spacer(s) 150 can be provided as a region of silicon nitride (SiN) with or without other insulating materials being included therein. The lateral space between gate spacer(s) 150 in structure 100 can be occupied by one or more inter-level dielectric (ILD) regions 160, which may include the same insulating material as STI(s) 140 or may include a different electrically insulator material. STI(s) 140 and ILD region 160 nonetheless constitute different components, e.g., due to STI(s) 140 being formed before metal gate(s) 120, and ILD region 160 being formed on fin(s) 110, metal gate(s) 120, and STI(s) 140 together.

As shown specifically in FIG. 2, each fin 110 can include a set of epitaxial regions 170 positioned below ILD regions 160 and adjacent to metal gates 120. Epitaxial regions 170 may be formed within fin 110, e.g., by forming openings within fin 110 and epitaxially growing another semiconductor material within the openings, thereby forming epitaxial regions 170 with a different material composition from the remainder of fin 110. Metal gates 120, predecessor gate structures (not shown), and/or their spacers 150 may shield a portion of the fin 110 when epitaxial regions 170 are being formed. Epitaxial regions 170 may initially include the same semiconductor material of fin 110, or a different semiconductor material before being implanted with dopants. Implanting dopants into epitaxial regions 170 may form the eventual source/drain regions of a device formed from structure 100. Epitaxial regions 170, after being implanted with dopants, may have a different composition from the remainder of fin 110. To form epitaxial regions 170, selected portions of fin 110 may be implanted with a strain-inducing material, such as silicon germanium or silicon carbon, formed on fins composed of silicon, silicon germanium, and/or silicon carbon. The dopants used to form epitaxial regions 170 may be doped in situ or an implantation process may be performed to affect only epitaxial regions 170 of structure 100. According to an example, fin 110 is not previously doped before epitaxial regions 170 are formed within structure 100. A dopant implantation process may be performed to dope both fin(s) 110 and epitaxial regions 170. If a lightly doped source/drain region is desired, the dopant implantation can occur after forming metal gates 120, but before forming spacer(s) 150. Further illustration of methods according to the disclosure is provided by reference to a lateral cross-section of FIG. 1 (e.g., along line 3-3), depicted in odd-numbered FIGS. 5, 7, 9, 11, and 13, and a longitudinal cross-section of FIG. 1 (e.g., along line 4-4), depicted in even-numbered FIGS. 4, 6, 8, 10, and 12.

Figure 5:
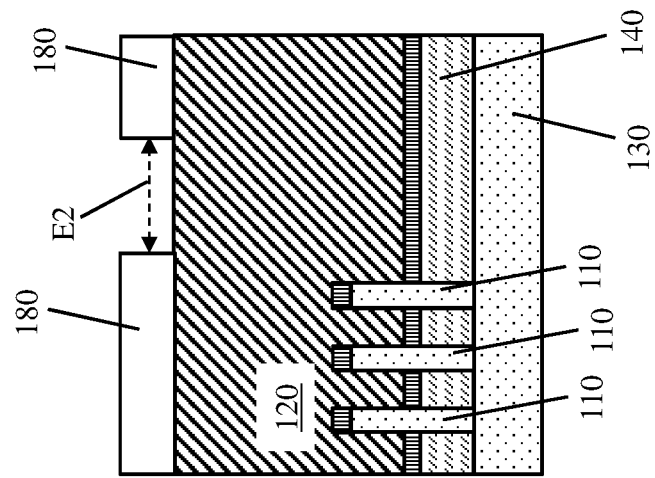
FIG. 5 shows a longitudinal cross-sectional view of forming a photoresist layer to target portions of a gate for removal according to the disclosure.
Figure 4:
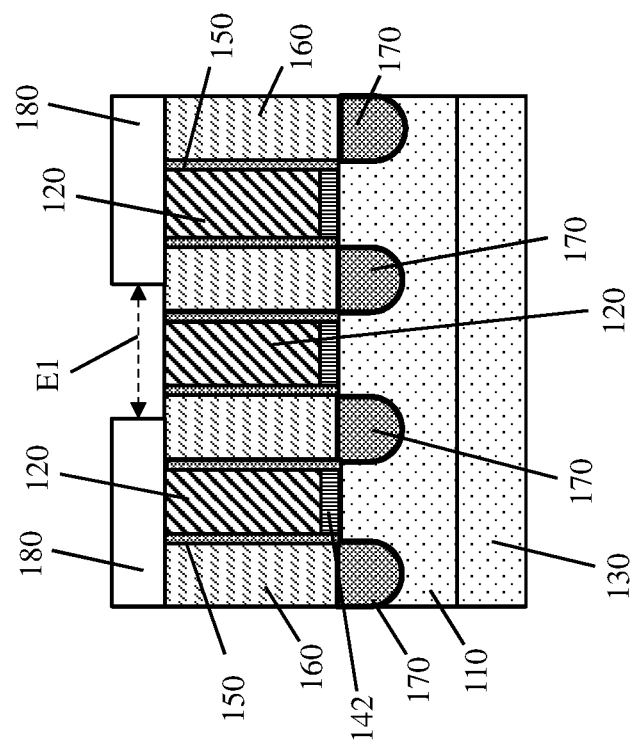
FIG. 4 shows a lateral cross-sectional view of forming a photoresist layer to target portions of a gate for removal according to the disclosure.

Turning to FIGS. 4 and 5, targeted portions of one or more metal gates 120 (FIGS. 1-3) may need to be removed and replaced with insulator material to provide physical and electrical separation between the conductive metal gates 120. Such insulator regions may include single diffusion breaks and/or end isolation regions as discussed elsewhere herein. Removing one or more metal gate(s) 120 (FIGS. 1-3) can also uncover underlying structures targeted for removal or modification (e.g., fin(s) 110, STI(s) 140, etc.) as described herein. Other portions of metal gate(s) 120 not targeted for removal (e.g., portions of metal gate(s) 120 not included within first and second locations L1, L2) may be left intact as processing according to the disclosure continues.

The disclosure may include forming a photoresist layer 180 on non-targeted metal gates 120, in addition to ILD regions 160. The term "photoresist layer" or "photoresist material," as used herein, refers to any currently known or later developed photo-sensitive material used in photolithography to transfer a pattern from a mask onto a wafer. Photoresist materials may include liquids deposited on the surface of the wafer as a thin film, which is then solidified by low temperature anneal. Photoresist layer 180 may be used to pattern and remove underlying metal gates 120 in order to uncover and target some portions of fin(s) 110 and STI(s) 140 for additional processing. As shown, photoresist layer 180 may be formed to include a first opening E1 (FIG. 4) positioned over metal gate(s) 120 which covers fin(s) 110, and a second opening E2 (FIG. 5) positioned over metal gate(s) 120 which covers STI(s) 140. Each opening E1, E2 may have a similar lateral width or different lateral width based on the size of underlying materials to be removed. According to an example, each opening E1, E2 in photoresist layer 180 may have a width of at most approximately three nanometers (nm). It is noted that openings E1, E2 may have substantially the same area profile as locations L1, L2, e.g., such that second opening E2 is longitudinally displaced from first opening E1 along the length of metal gate(s) 120.

Figure 6:
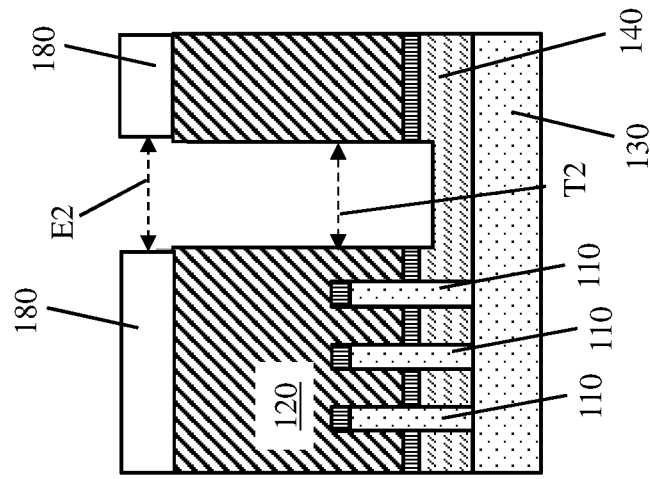
FIG. 6 shows a lateral cross-sectional view of removing portions of a metal gate to form a first trench according to the disclosure.
Figure 7:
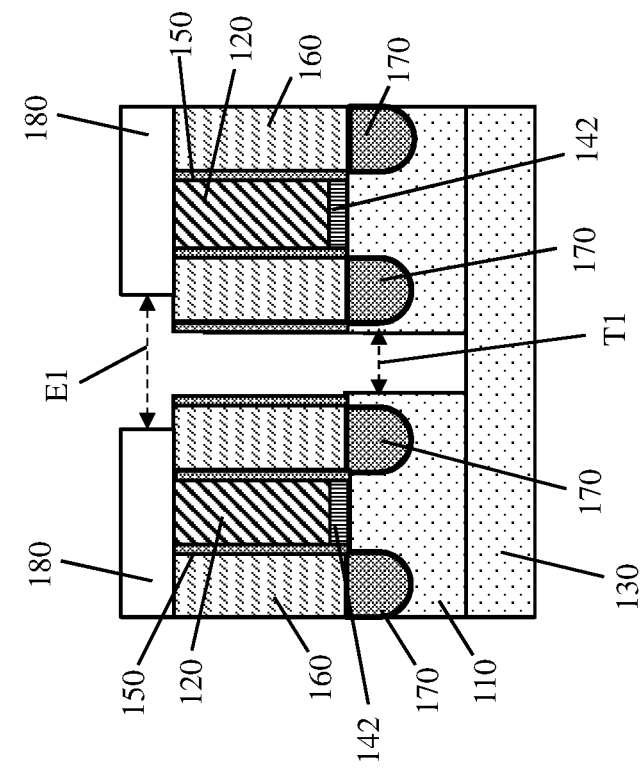
FIG. 7 shows a longitudinal cross-sectional view of removing portions of a metal gate to form a second trench according to the disclosure.
Figure 14:
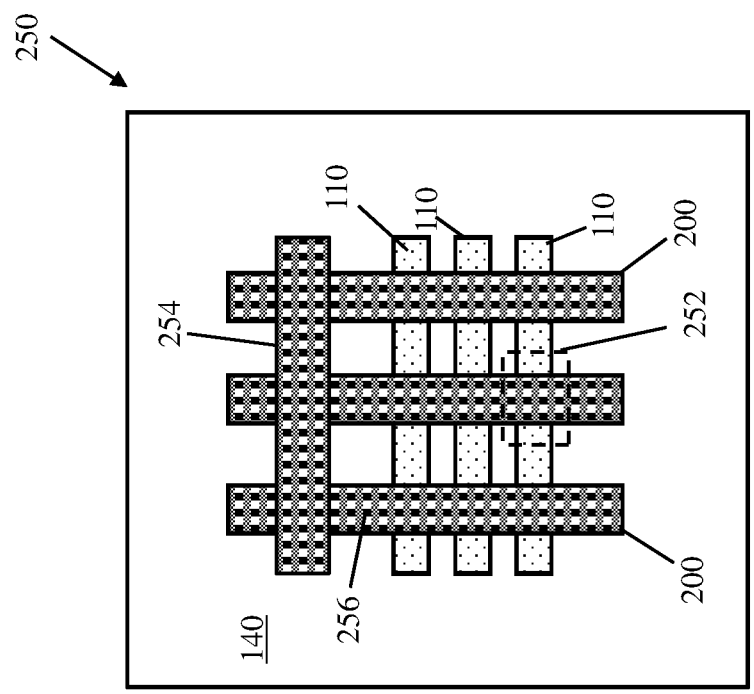
FIG. 14 shows a plan view of a structure with SDB and end isolation regions according to the disclosure.

FIGS. 6 and 7 depict the etching of metal gates 120 beneath openings E1, E2 (FIGS. 4 and 5) in photoresist layer 180 to expose underlying portions of fin(s) 110 and STI(s) 140. Portions of each metal gate 120 exposed within openings E1, E2 can be removed by way of a selective or non-selective vertical etching, such that photoresist layer 230 protects other metal gates 120 and ILD regions 160 from being removed. The same etching process may also remove underlying gate dielectrics 142 from beneath the exposed metal gates 120, as well as portions of fin(s) 110 beneath first opening E1 and underlying portions of STI(s) 140 beneath second opening E2. Removing portions of fin(s) 110 beneath opening(s) E1 may form a first trench T1 (FIG. 6 only) in ILD region 160 to substrate 130 thereunder, or at least partially into fin(s) 110. Although one fin 110 is shown in the cross-section of FIG. 6, first trench T1 may extend longitudinally into and out of the plane of the page to expose other fins 110 located within other lateral cross-sections. The shape of first trench T1 thereby allows insulating materials to be formed over one fin 110 or multiple fins 110, e.g., within the surface area of first location L1 (FIG. 1), and as depicted in FIG. 14 and discussed elsewhere herein.

In the same etching process, or optionally a subsequent etching with a different photoresist layer 180, metal gate(s) 120 and ILD regions 160 exposed within opening(s) E2 may form a second trench T2 (FIG. 7 only) to expose a portion of STI(s) 140 thereunder. Second trench T2 may extend in a lateral direction (i.e., substantially parallel to the orientation of fins 110), into and out of the plane of the page, such that second trench T2 is formed within a removed portion of metal gate(s) 120 and removed portions of ILD 160 laterally adjacent to the removed portions of metal gate(s) 120. Second trench T2 therefore is shaped and positioned for insulating material to be formed on STI(s) 140 at a location displaced from fin(s), e.g., within the surface area of second location L2 (FIG. 1). Second trench T2 may be longitudinally displaced from first trench T1 along a length of metal gate(s) 120 as noted elsewhere herein. Any remaining spacer materials adjacent to the removed metal gate(s) 120 may remain intact as a spacer liner 190 (FIG. 6) on the sidewalls of each ILD region 160. It is also understood that gate spacer(s) 150 may be completely removed with metal gate(s) 120 in further embodiments. According to an example, first trench T1 may have a greater depth than second trench T2. The difference in depth between each trench T1, T2 may stem from differences in the etch rate of STI(s) 140 as compared to the semiconductor materials within fin(s) 110 and substrate 130. These structural differences between each trench T1, t2 may cause first trench T1 to be particularly suited to forming SDB regions while causing second trench T2 to be particularly suited to forming end isolation regions.

Turning to FIGS. 8 and 9, continued processing may include removing photoresist layer 180 (FIGS. 4-7) to uncover ILD region(s) 160 and non-removed metal gate(s) 120. Techniques appropriate for removing photoresist layer 180 may include stripping, ashing, and/or other processes for selectively removing photoresist materials without affecting other exposed materials. The remaining structure may continue to include first trench T1 extending into fin(s) 110 and second trench T2 extending into ILD(s) 140. As shown in FIGS. 8 and 9, first trench T1 may have a depth below the upper surface of remaining metal gate(s) 120 that is greater than a depth D2 of second trench T2 below the upper surface of metal gate(s) 120. The difference in depths D1, D2 may stem from differences in the etch rate of fin(s) 110 and STI(s) 140 when trenches T1, T2 are formed as noted elsewhere herein.

Figure 10:
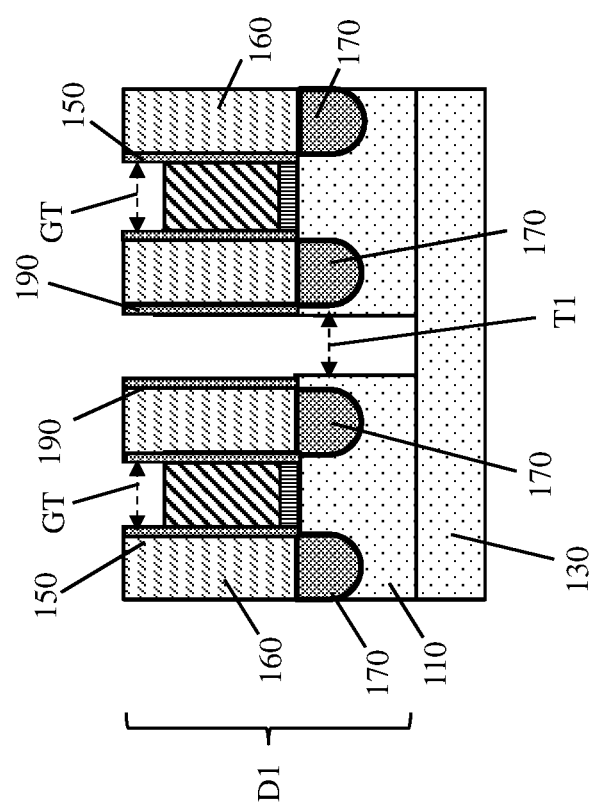
FIG. 10 shows a lateral cross-sectional view of forming a gate trench in a set of metal gates according to the disclosure.
Figure 11:
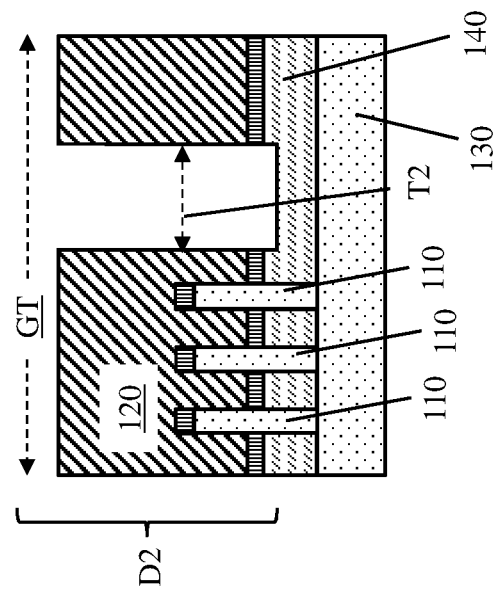
FIG. 11 shows a longitudinal cross-sectional view of forming a gate trench in a metal gate according to the disclosure.

Continuing to FIGS. 10 and 11, the disclosure may optionally include further processing of the non-removed metal gates 120 to allow additional insulators to be formed between metal gates 120 and overlying materials. After removing photoresist layer 180 (FIGS. 4-7), the upper surface of any remaining metal gates 120 may be susceptible to additional selective etching of conductive materials. To selectively etch metal gates 120 while leaving non-metal or non-conductive materials intact, the disclosure may include contacting each exposed surface with a wet etching solution configured to selectively remove exposed metals, e.g., diluted hydrofluoride (dHF) solutions, sulfuric peroxide mix (SPM) or "Piranha" solutions including sulfuric acid ($H_2SO_4$) and hydrogen peroxide ($H_2O_2$), phosphoric acid ($H_3PO_4$) based etchants, or other conventional wet etching materials. The etching solution may be selected to keep gate spacers 150 intact as metal gates 120 are removed. The amount of etching solution or other selective etchant may be controlled such that selectively etching metal gates 120 leaves at least a portion of each metal gate 120 intact below the etched regions. The removed portions of each metal gate 120 can form a set of gate trenches GT above each gate metal 120.

Figure 13:
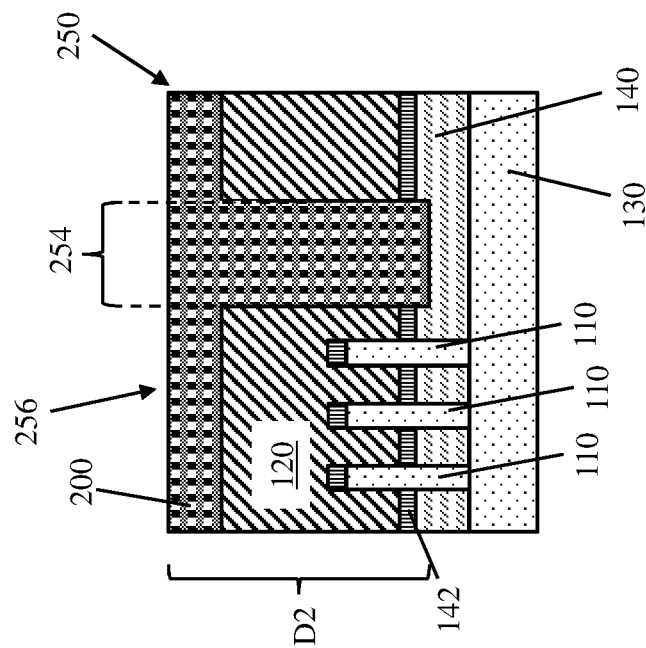
FIG. 13 shows a longitudinal cross-sectional view of forming an insulator in the second trench and gate trenches, and the resulting structure, according to the disclosure.
Figure 12:
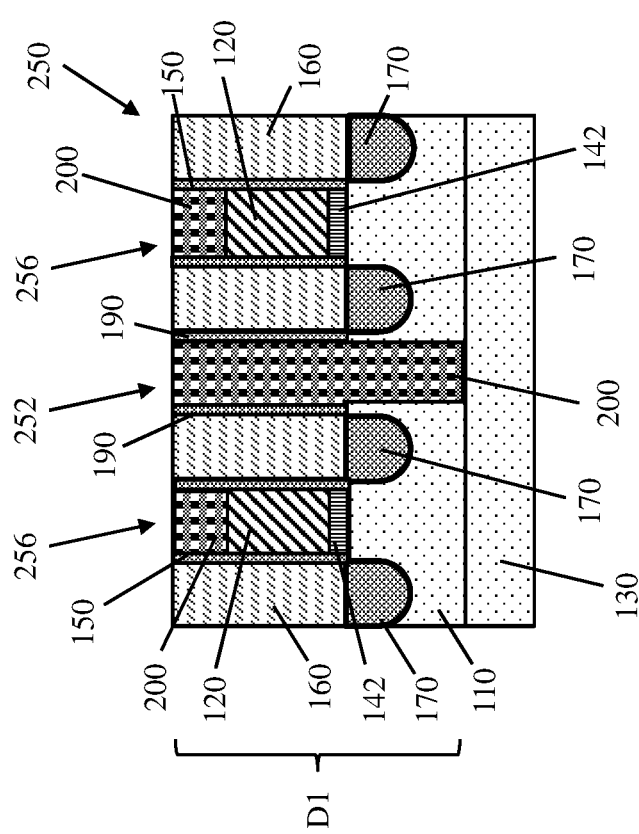
FIG. 12 shows a lateral cross-sectional view of forming an insulator in the first trench and gate trenches, and the resulting structure, according to the disclosure.

Turning now to FIGS. 12 and 13, the design of a product may require electrical isolation between portions of one fin 110 in addition to the longitudinal electrical separation of different metal gates 120. Thus, continued processing according to the disclosure may include forming an insulator material within first trench T1 (FIGS. 6, 8, 10), second trench T2 (FIGS. 7, 9, 11), and within any previously-formed gate trenches GT (FIGS. 10 and 11). According to an embodiment, each trench T1, T2, GT, may be filled with an insulator 200 composed of, e.g., one or more currently known or later developed insulating materials to structurally separate and electrically isolate two or more regions of semiconductor or conductor material from each other. In a particular example, insulator 200 may include silicon nitride (SiN) or one or more other nitride insulators. Insulator 200 may additionally or alternatively include an oxide-based insulator and/or other materials configured to inhibit or prevent the transmission of electric currents therethrough. Insulator 200 positioned within fin(s) 110 may exhibit depth D1 of the previously formed first trench T1, while insulator 200 positioned on STI 140 may exhibit depth D2 of the previously formed second trench T2.

Insulator 200 may be formed by way of non-selective or selective deposition to fill trenches T1, T2, GT and in the case of non-selective deposition may cause insulator 200 to cover ILD region(s) 160 after filling trenches T1, T2, GT. In these instances, methods according to the disclosure may include applying chemical mechanical planarization (CMP) to remove any portions of insulator 200 positioned on and above ILD region(s) 160, causing the upper surface of insulator 200 to be substantially coplanar with the upper surface of ILD region(s) 160. In the case of selective deposition, insulator 200 can be formed selectively on semiconductor materials (e.g., fins 110 and substrate 130), and other insulating materials with the same or similar composition (e.g., portions of STI(s) 140 and/or gate liners 190), without additional insulator material being formed in direct contact with OPL 200.

Forming insulator 200 within trenches T1 (FIGS. 6, 8, 10), T2 (FIGS. 7, 9, 11), and any gate trenches GT (FIGS. 10, 11) may yield an IC structure 250 according to the disclosure. As shown specifically in FIG. 12, portions of insulator 200 positioned on and within fins 110 may form a single diffusion break (SDB) region 252 of structure 250, e.g., to electrically separate two semiconductor regions of one fin 110 from each other. Other portions of insulator 200 positioned above STI(s) 140 may form end isolation regions 254 (FIG. 13) positioned at a lateral end of any remaining metal gate(s) 120, and extending substantially in parallel with fins 110. The processes discussed herein may particularly suitable for creating end isolation region(s) 254 laterally abutting and positioned at a longitudinal end of one remaining metal gates 120. End isolation region(s) 254 thus may divide the remaining metal gate(s) 120 into laterally distinct regions, each isolated from each other by insulator 200 within end isolation region(s) 254. Although SDB region(s) 252 and end isolation region(s) 254 each may be formed from insulator 200 during a single deposition, they may provide different structural purposes in these locations. Thus, methods according to the disclosure provide a unified process of forming SDB regions 252 and end isolation regions 254 after metal gate replacement with a single implementation of the various etching and deposition processes described herein. Again, it is noted that the number of SDB regions 252 and end isolation regions 254 may vary between implementations, and that insulator 200 may be deposited to form only a single SDB region 252 or end isolation region 254, as well as multiple SDB regions 252 or end isolation regions 254 to suit different products and/or intended functions.

Referring to FIGS. 12-14, IC structure 250 according to the disclosure may further include an insulator cap region 256, alternatively known as a "middle of line (MOL)" insulator, positioned above metal gates 120. Insulator cap region 256, as discussed elsewhere herein, may be formed together with SDB regions 252 and end isolation regions 254 to provide additional electrically separation between metal gates 120 and other components formed above metal gates 120. The presence of insulator cap region 256 may also reduce electromigration degradation of the structure during operation. Some portions of insulator cap region 256 may be subsequently etched to form vias and/or other electrically conductive coupling components to metal gates 120. As shown best in FIG. 13, insulator cap region 256 may be structurally continuous with SDB regions 252 and/or end isolation regions 256 as a result of being formed from insulator 240 as trenches T1, T2, GT (FIGS. 6-11) are filled together in a single insulator deposition or group of insulator depositions. FIG. 12 further illustrates that IC structure 250 may include at least one source/drain region 170 of fin(s)

110 positioned laterally between SDB region(s) 252 and the location of one metal gate 120.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
    providing a structure including:
        a plurality of fins positioned on a substrate,
        a plurality of shallow trench isolations (STIs) each positioned on the substrate laterally adjacent to one of the plurality of fins,
        a plurality of gates extending transversely across the plurality of fins, and
        an insulator region positioned laterally between the plurality of fins,
    forming a first trench by removing a portion of one of the plurality of gates and an underlying portion of one of the plurality of fins to expose the substrate thereunder;
    forming a second trench by removing portions of the plurality of gates to expose one of the plurality of STIs thereunder, the second trench extending substantially in parallel with the plurality of fins and positioned adjacent to a lateral end of a remaining portion of one of the plurality of gates; and
    forming an insulator within the first and second trenches.

2. The method of claim 1, further comprising forming a plurality of gate trenches by selectively removing a portion of each of the plurality of gates, after forming the second trench, wherein the forming of the insulator includes forming the insulator within each of the plurality of gate trenches.

3. The method of claim 1, wherein a depth of the first trench below an upper surface of the insulator region is greater than a depth of the second trench below an upper surface of the remaining portion of the insulator region.

4. The method of claim 1, wherein the second trench is distal to the first trench along a length of the plurality of gates.

5. The method of claim 1, wherein forming the insulator includes filling the first and second trenches with a single insulating material.

6. The method of claim 1, wherein forming the insulator on the exposed substrate forms a single diffusion break (SDB) within the one of the plurality of fins.

7. The method of claim 1, wherein forming the insulator on the exposed one of the plurality of STIs forms an end isolation region adjacent to the lateral end of the remaining portion of one of the plurality of gates.

8. A method of forming an integrated circuit (IC) structure, the method comprising:
    providing a structure including:
        a plurality of fins positioned on a substrate,
        a plurality of shallow trench isolations (STIs) each positioned on the substrate laterally adjacent to one of the plurality of fins,
        a plurality of gates extending transversely across the plurality of fins, and
        an inter-level dielectric (ILD) region positioned laterally between the plurality of fins,
    forming a first trench by removing a portion of one of the plurality of gates and an underlying portion of one of the plurality of fins to expose the substrate thereunder;
    forming a second trench by removing portions of the plurality of gates to expose one of the plurality of STIs thereunder, the second trench extending substantially in parallel with the plurality of fins and positioned adjacent to a lateral end of a remaining portion of one of the plurality of gates;
    forming a plurality of gate trenches by selectively removing a portion of each of the plurality of gates; and
    forming an insulator within the first trench, the second trench, and the plurality of gate trenches.

9. The method of claim 8, wherein forming the insulator in the second trench forms an end isolation region adjacent to the lateral end of the plurality of gates.

10. The method of claim 8, wherein a depth of the first trench below an upper surface of the insulator region is greater than a depth of the second trench below an upper surface of the remaining portion of the insulator region.

11. The method of claim 8, wherein the second trench is distal to the first trench along a length of the plurality of metal gates.

12. The method of claim 8, wherein forming the insulator within the first trench forms a single diffusion break (SDB) within one of the plurality of fins.

13. The method of claim 8, wherein forming the insulator includes filling the first trench, the second trench, and the plurality of gate trenches with a single insulating material.

14. The method of claim 13, wherein the single insulating material includes a nitride material, and wherein the insulator region includes an oxide material.

\* \* \* \* \*